United States Patent
Hudson et al.

(10) Patent No.: US 8,374,507 B2
(45) Date of Patent: Feb. 12, 2013

(54) DIGITAL MULTIMETER HAVING REMOTE DISPLAY WITH AUTOMATIC COMMUNICATION BINDING

(75) Inventors: Jeffrey C. Hudson, Snohomish, WA (US); Nathaniel J. Wetzel, Seattle, WA (US); Glen Howard Vetter, Stanwood, WA (US)

(73) Assignee: Fluke Corporation, Everett, WA (US)

( * ) Notice: Subject to any disclaimer, the term of this patent is extended or adjusted under 35 U.S.C. 154(b) by 614 days.

(21) Appl. No.: 12/563,004

(22) Filed: Sep. 18, 2009

(65) Prior Publication Data

US 2011/0069961 A1    Mar. 24, 2011

(51) Int. Cl.
    *H04B 10/00* (2006.01)
(52) U.S. Cl. .................. 398/115; 398/116; 398/117
(58) Field of Classification Search ........... 398/115–117
    See application file for complete search history.

(56) References Cited

U.S. PATENT DOCUMENTS

| | | | |
|---|---|---|---|
| 4,608,532 A | 8/1986 | Ibar et al. |
| 4,942,356 A | 7/1990 | Ellingen et al. |
| 5,640,155 A | 6/1997 | Springer |
| 6,043,640 A | 3/2000 | Lauby et al. |
| 6,436,038 B1 | 8/2002 | Engstrom |
| 6,445,175 B1 | 9/2002 | Estep et al. |
| 6,466,003 B1 | 10/2002 | Gallavan et al. |
| 6,568,848 B1 | 5/2003 | Chapman |
| 6,784,855 B2 | 8/2004 | Matthews et al. |
| 6,812,685 B2 | 11/2004 | Steber et al. |
| 7,034,517 B2 | 4/2006 | Newcombe |
| 7,075,289 B2 | 7/2006 | Chen |
| 7,109,700 B2 | 9/2006 | Fazzina |
| 7,183,999 B2 | 2/2007 | Matthews et al. |
| 7,304,618 B2 * | 12/2007 | Plathe | ......................... 345/2.3 |
| 7,382,272 B2 | 6/2008 | Feight |
| 7,411,577 B2 | 8/2008 | Kim et al. |

(Continued)

FOREIGN PATENT DOCUMENTS

| DE | 202004011873 U1 | 12/2004 |
|---|---|---|
| FR | 2873839 A1 | 2/2006 |

(Continued)

OTHER PUBLICATIONS

Broesch, J.D.; Petersen, P.I.; Hansink, M.J., Abstract of article entitled, "A handheld, free roaming, data display for DIII-D diagnostic data," IEEE Transactions on Nuclear Science, published Apr. 2000.

U.S. Appl. No. 12/356,885, filed with the United States Patent and Trademark Office on Jan. 21, 2009.

Extended search report issued on Jan. 24, 2011 regarding corresponding EPO application No. 10169871.0.

(Continued)

*Primary Examiner* — Danny Leung
(74) *Attorney, Agent, or Firm* — Nelson Mullins Riley & Scarborough LLP

(57) ABSTRACT

An electrical test instrument comprising a base unit having a first communication address. A remote display unit separate from the base unit and having a second communication address is also provided. Communication circuitry is operative to provide electrical communication in a first RF mode between the base unit and the remote display unit as a bound communication pair based on the first and second communication addresses. The communication circuitry is further operative to operate selectively in a second secure communication mode. The first and second communication addresses are exchanged in the second secure communication mode to establish the bound communication pair for subsequent communication in the first RF mode. In some exemplary embodiments, the second communication mode is an optical communication mode (e.g., an IR communication mode).

14 Claims, 6 Drawing Sheets

U.S. PATENT DOCUMENTS

| | | | |
|---|---|---|---|
| 2003/0137310 A1 | 7/2003 | Holzel | |
| 2003/0184515 A1 | 10/2003 | Tsai | |
| 2004/0160410 A1 | 8/2004 | Plathe | |
| 2004/0239308 A1 | 12/2004 | Fazzina | |
| 2005/0231134 A1 | 10/2005 | Sid | |
| 2005/0246295 A1 | 11/2005 | Cameron | |
| 2006/0022663 A1 | 2/2006 | Chen | |
| 2006/0119540 A1 | 6/2006 | Dobson et al. | |
| 2008/0143317 A1 | 6/2008 | Dave | |
| 2008/0231256 A1 | 9/2008 | Cox et al. | |
| 2009/0202250 A1* | 8/2009 | Dizechi et al. | 398/107 |
| 2011/0069961 A1 | 3/2011 | Hudson et al. | |

FOREIGN PATENT DOCUMENTS

| | | |
|---|---|---|
| TW | M257451 A1 | 2/2005 |
| WO | 2005/124370 A1 | 12/2005 |

OTHER PUBLICATIONS

Non-Final Office Action dated Jul. 5, 2011 issued for U.S. Appl. No. 12/356,685, filed Jan. 21, 2009.

Amendment filed with the U.S. Patent and Trademark Office on Sep. 21, 2011 for U.S. Appl. No. 12/356,885, filed Jan. 21, 2009.

Supplement to Amendment filed with the U.S. Patent and Trademark Office on Dec. 28, 2011 for U.S. Appl. No. 12/356,885, filed Jan. 21, 2009.

Non-Final Office Action dated Jan. 11, 2012 issued for U.S. Appl. No. 12/356,885, dated Jan. 21, 2009.

Request for Reconsideration filed with the U.S. Patent and Trademark Office on Jun. 11, 2012 for U.S. Appl. No. 12/356,885, filed Jan. 21, 2009.

* cited by examiner

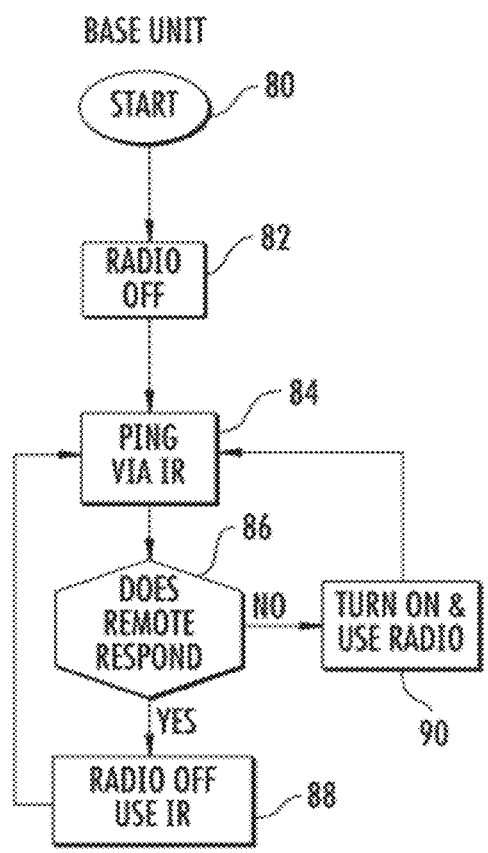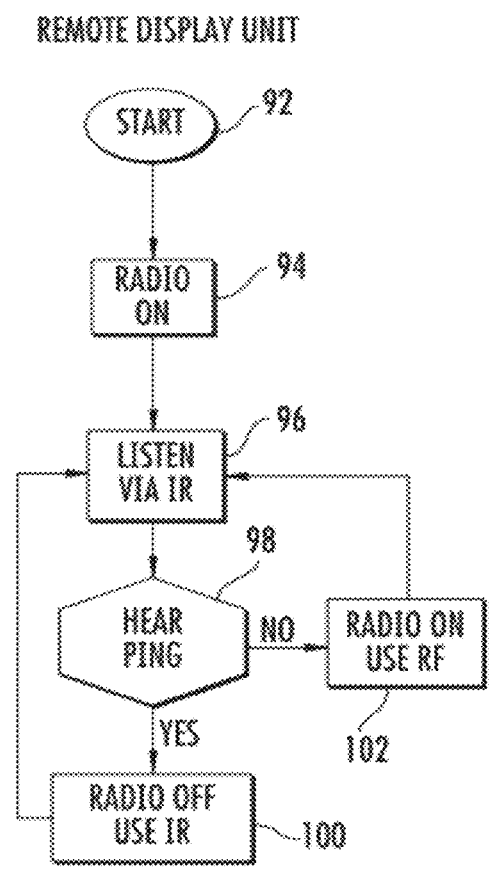

DIGITAL MULTIMETER HAVING REMOTE DISPLAY WITH AUTOMATIC COMMUNICATION BINDING

BACKGROUND OF THE INVENTION

The present invention relates generally to digital multimeters. More particularly, the invention relates to a digital multimeter having a remote display unit which automatically binds for communication with a base unit.

Digital multimeters (DMMs) function to measure a number of electrical parameters as needed for service, troubleshooting and maintenance. Such parameters may include AC voltage and current, DC voltage and current, resistance and continuity. In some cases, a DMM may measure other parameters such as capacitance and temperature.

A DMM will often be configured as a hand-held unit having a rotary knob by which various functions are selected. A plurality of lead jacks are provided in the case (i.e., housing) of the unit for connection of test leads. The specific jack used may depend on the function that has been selected. An LCD display provides a reading of the tested parameter. Details regarding the construction and operation of multimeters may be discerned from U.S. Pat. Nos. 7,034,517, 6,466,003 and 6,043,640, each of which is incorporated herein by reference in its entirety.

Generally, it is desired to place the DMM on a flat surface such as a shelf as measurements are being conducted. Often, however, the shelf may be in a position making it difficult to view the LCD display. In this circumstance, the user may be required to look away from the point of measurement in order to see the measurement reading. A remote display, separate from the DMM but linked by communication to the DMM, may be used to lessen this difficulty. Examples of remote displays are shown in U.S. Pub. No. 2003/0137310 to Holzel and U.S. Pat. No. 7,304,618 to Plathe.

The remote display may use radio frequency (RF) coupling for communication with the DMM. In some situations, however, more than one DMM may be in range of the remote display. If this occurs, it is possible that the remote display could undesirably show results from a DMM different from the one being operated by the user. It is thus desirable for the remote display and DMM to be bound for communication by an addressing technique in which each remote display "knows" the address of its associated DMM, and vice versa.

SUMMARY OF THE INVENTION

According to one aspect, the present invention provides an electrical test instrument comprising a base unit having a first communication address. A remote display unit separate from the base unit and having a second communication address is also provided. Communication circuitry is operative to provide electrical communication in a first RF mode between the base unit and the remote display unit as a bound communication pair based on the first and second communication addresses. The communication circuitry is further operative to operate selectively in a second secure communication mode. The first and second communication addresses are exchanged in the second secure communication mode to establish the bound communication pair for subsequent communication in the first RF mode. In some exemplary embodiments, the second communication mode is an optical communication mode (e.g., an IR communication mode).

Often, it may be desirable for the remote display unit to be matable with the base unit. In such embodiments, the communication circuitry may automatically switch to the second secure communication mode when the remote display unit is mated with the base unit. For example, the communication circuitry may provide electrical communication in the first RF mode when the base unit and the remote display unit are spaced apart and in the second secure communication mode when the base unit and the remote display unit are adjacent to one another. In this regard, the communication circuitry may attempt to establish communication from the base unit in an IR communication mode and then switch to an RF communication mode if IR communication is unsuccessful.

Another aspect of the present invention provides a method of automatically binding first and second devices for RF communication. One step of the method involves establishing a secure, non-RF communication mode between the first and second devices. According to another step, first and second communication addresses respectively identifying the first and second devices are exchanged in the secure, non-RF communication mode such that the first and second devices will recognize each other as communication partners. The secure, non-RF communication mode is then terminated and an RF communication mode is established between the first and second devices as a first bound pair.

Further steps of the method may involve subsequently establishing a secure, non-RF communication mode between the first device and a third device. The first communication address and a third communication address respectively identifying the first and third devices are exchanged in the secure, non-RF communication mode such that the first and third devices will recognize each other as communication partners. The secure, non-RF communication mode between the first and third devices is then terminated and the RF communication mode is established between the first and third devices as a second bound pair.

A still further aspect of the present invention provides a first device and a second device each having control circuitry, IR interface circuitry and RF transceiver circuitry. The control circuitry has associated memory for storing an address of a current RF communication partner. The first and second devices have a respective first address and second address for RF communication. Further, the first and second devices exchange the first and second addresses with each other via the IR interface circuitry such that the first device will recognize the second device as its RF communication partner and the second device will recognize the first device as its RF communication partner. The first and second devices are then operative to communicate via the RF transceiver circuitry.

An additional aspect of the present invention provides a device capable of establishing RF communication with a paired device of a communication pair. The device comprises IR interface circuitry and RF transceiver circuitry. Control circuitry having associated memory for storing a partner address of a current RF communication partner is also provided. The control circuitry is operative to receive the partner address via the IR interface circuitry in an IR communication mode. In addition, the control circuitry utilizes the partner address to communicate with the paired device in an RF communication mode.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which:

FIGS. 5 and 6 are flowcharts respectively showing the manner in which the base unit and the remote display unit automatically select a communication mode;

Figure 1:
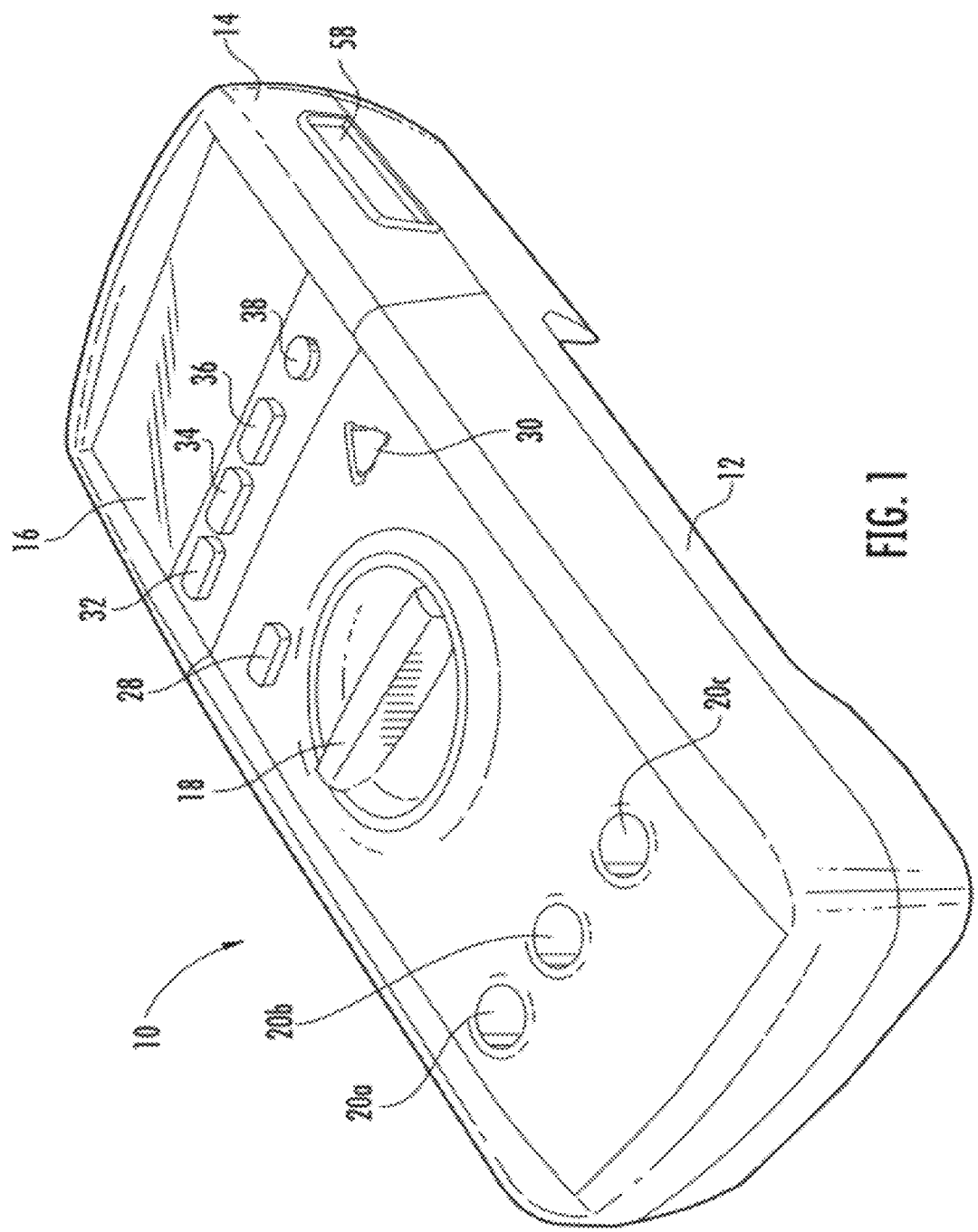
FIG. 1 is a perspective view of a DMM constructed in accordance with an embodiment of the present invention.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary constructions.

FIG. 1 illustrates a digital multimeter (DMM) 10 constructed in accordance with an embodiment of the present invention. Multimeter 10 comprises a base unit 12 and a remote display unit 14. The housing of base unit 12 defines an interior cavity in which various internal components are located. In this embodiment, the housing of base unit 12 is preferably formed having two or more housing members which are assembled together to form the interior cavity. Preferably, these housing members may be molded of high impact rigid plastic material. In some cases, it may be desirable to overmold a softer polymeric material on at least portions of the rigid plastic material to enhance gripability and user comfort.

In this case, remote display unit 14 is mated to base unit 12 such that its display 16 will be located in a conventional position on the overall DMM. Display 16, which will typically be an LCD display located behind a transparent window, shows a variety of information of interest to the user. Preferably, display 16 will include a backlight that may be activated when desired to facilitate use in low-light conditions. Both numeric and symbolic characters may appear on display 16 depending on the operating mode of the DMM and other factors. For example, a 4-digit, 7-segment numeric display may serve as the primary icons.

In this embodiment, base unit 12 includes a rotary selector knob 18 which allows the user to select a particular multimeter function. For example, 5-10 such functions may be indicated by respective stop positions in the knob rotation. As one skilled in the art will appreciate, suitable graphics will typically be printed on the top surface of the base unit housing to indicate the respective functions.

Figure 3:
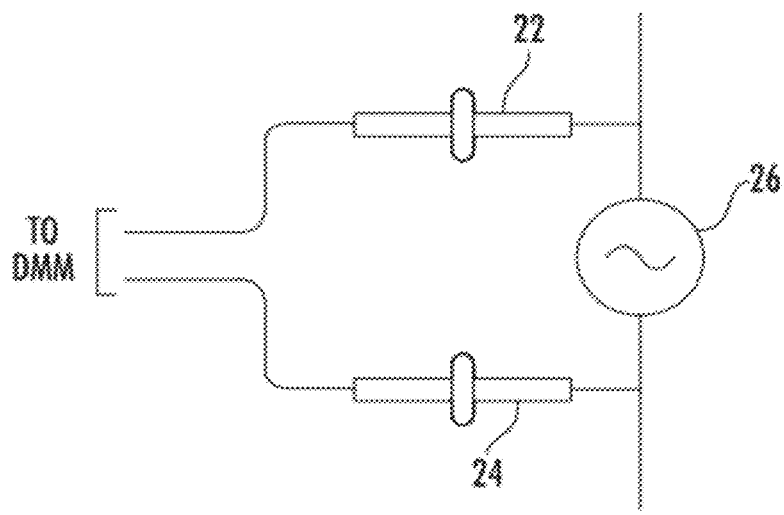
FIG. 3 is a diagrammatic representation showing test leads of a DMM connected to a circuit under test.

Base unit 12 also includes a plurality of jacks 20a-c for connection of respective test leads. In particular, two test leads are connected to a respective two of lead jacks 20a-c depending on the parameter being tested. In this regard, FIG. 3 shows a pair of test leads 22 and 24 connected to a circuit 26 under test.

Referring again to FIG. 1, certain additional features of DMM 10 will now be explained. In this regard, DMM 10 may include a shift key 28 located on base unit 12. Shift key 28 allows the user to select alternate functions for respective positions of selector knob 18. A high voltage indicator light 30 alerts a user who may not be viewing the remote display unit 14 (when separated from base unit 12) that the test lead has encountered a high voltage situation.

In this embodiment, a number of function buttons are also provided on remote display unit 14. Typically, these buttons will relate to functions dealing directly with the display rather than the operating parameters of DMM 10. In the illustrated embodiment, for example, a total of four function buttons are provided on remote display unit 14: hold button 32, min/max button 34, range button 36 and backlight button 38. As its name implies, backlight button 38 activates the internal light used to illuminate the LCD display.

Figure 2:
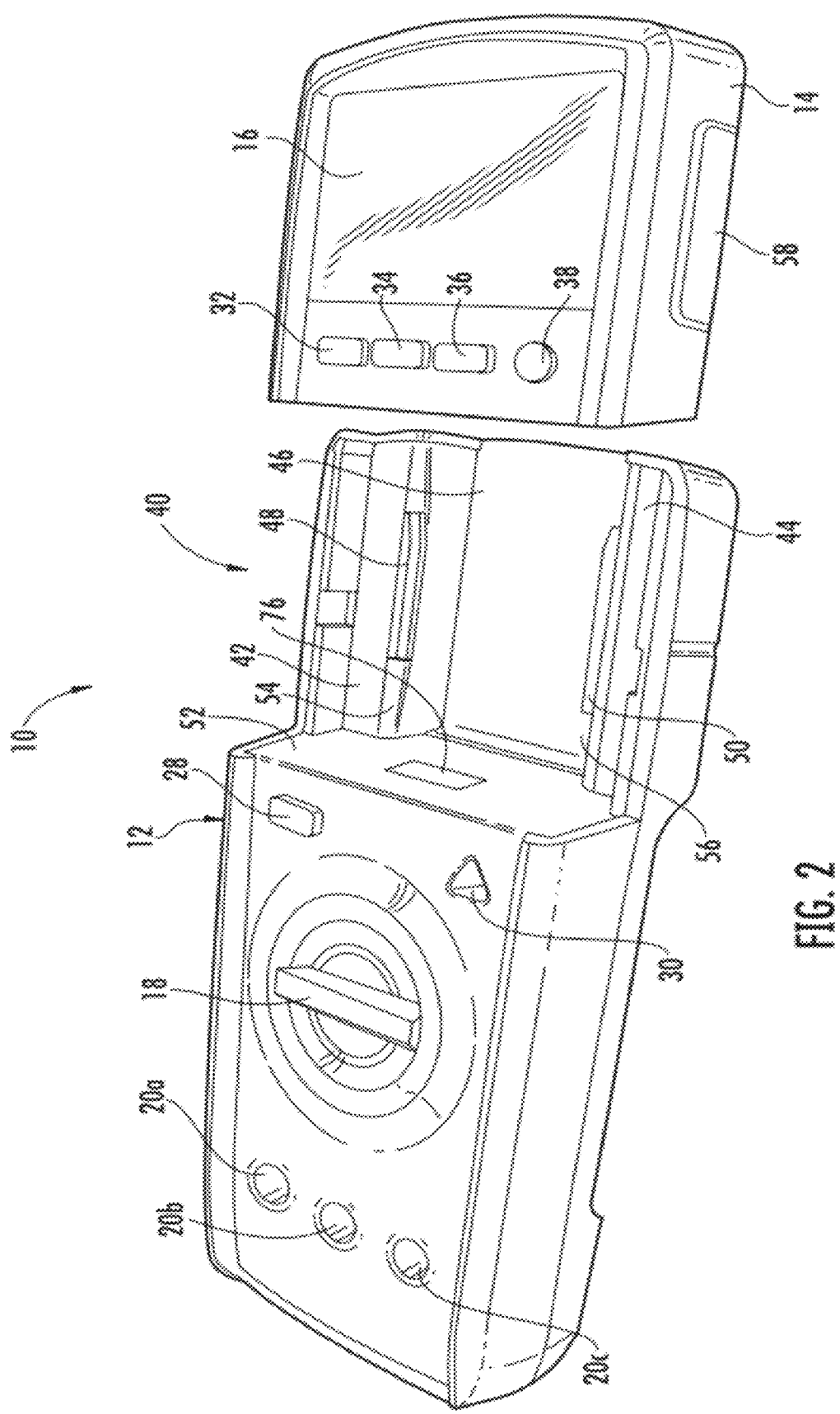
FIG. 2 is a perspective view of the DMM of FIG. 1 showing separation of the remote display unit.

FIG. 2 shows the manner in which remote display unit 14 is removed from base unit 12 in the illustrated embodiment. In this case, base unit 12 defines a receiving portion 40 at which remote display unit 14 is slidably mated. Receiving portion 40 defines a pair of lateral rails 42 and 44 located on either side of a recess 46. The back of remote display unit 14 is generally complementary to the configuration of receiving portion 40.

A suitable latching mechanism is preferably provided to retain remote display unit 14 with respect to base unit 12. When it is desired to separate remote unit from base unit 12, the latching mechanism is easily releasable by the user. In this embodiment, for example, rails 42 and 44 include respective flanges 48 and 50 extending part of the way along their length. In particular, flanges 48 and 50 terminate before reaching wall 52 of base unit 12 to define respective gaps 54 and 56. The end projection of a spring-loaded arm is received in the respective gap 54 or 56 so as to engage the flange 48 or 50, respectively, when remote display unit 14 is mated with base unit 12. The arms are released by pressing in an associated button on the side of remote display unit 12, such as button 58, when it is desired to remove remote display unit 12. The user can then simply slide remote display unit 14 until it is completely separated from base unit 12.

As will now be explained, remote display unit 14 will preferably communicate with base unit 12 using RF communication when the two units are separated from each other. RF communication is advantageous because it does not require a direct line of sight between base unit 12 and remote display unit 14. When remote display unit 14 is attached to base unit 12, however, a second mode of communication is utilized. In this embodiment, for example, DMM 10 utilizes IR communication when remote display unit 14 is mated to consume less battery power than the RF mode. As one skilled in the art will appreciate, however, direct electrical connection can alternatively be used when remote display unit 14 is docked. Generally, however, it will be preferable to utilize wireless communication even when the two units are mated to eliminate the need for exposed metal conductors. The switch between RF and IR communication preferably occurs automatically when remote display unit 14 is either mated or separated from base unit 12.

Figure 4:
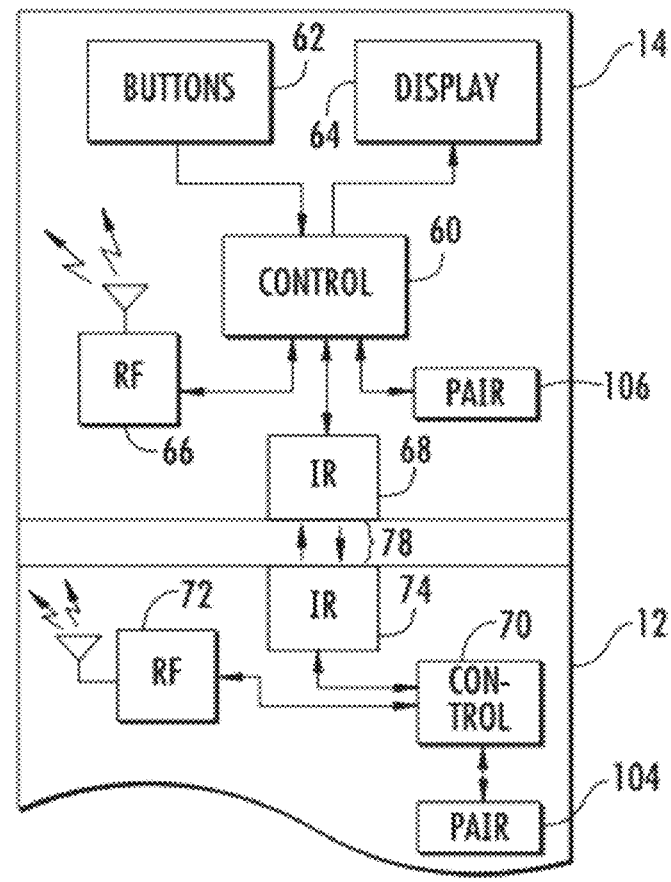
FIG. 4 is a diagrammatic representation showing communication between the remote display unit and base unit when the remote display unit is mated with the base unit.

Referring now to FIG. 4, remote display unit 14 includes control circuitry 60, which receives inputs from buttons 62 and provides information to display 64. Control circuitry 60 also selects whether to communicate with base unit 12 via RF transceiver 66 or IR interface 68. RF transceiver 66 may include any circuit components necessary in order to effect RF communication with base unit 12. These may include a digital-to-analog converter, frequency generator, modulator and antenna. Similarly, IR interface 68 will include components necessary for IR communication, such as an IR-LED and photodetector. As one skilled in the art will appreciate, control circuitry 60 may be implemented in hardware, firmware, software, or a combination thereof as necessary or desirable.

Base unit 12 will likewise include circuit elements used in communicating with remote display unit 14. For example, control circuitry 70 (which may be implemented as hardware, firmware, software, or a combination thereof) is in electrical communication with an RF transceiver 72 and IR interface 74. Control circuitry 70 determines whether communication with remote display unit 14 should occur by RF transceiver 72 or IR interface 74. Both base unit 12 and remote display unit 14 are preferably equipped with an IR transmissive window, such as window 76 of base unit 12 (FIG. 2), which are aligned when remote display unit 14 is mated in order to provide the desired line of sight between IR interface 68 and IR interface 74 (as shown at 78 in FIG. 4).

FIGS. 5 and 6 illustrate respective processes that may be performed by control circuitry 70 and control circuitry 60 in order to switch communication between RF and IR modes as described above. Referring first to FIG. 5, the process implemented by control circuitry 70 begins as indicated at 80. Initially, the "radio" will be off (as indicated at 82), meaning that there will be no RF communication as this point. As indicated at 84, base unit 12 next "pings" remote display unit 14 via the IR interface. Then, as indicated at 86, control circuitry 60 waits for a predetermined period of time for a response from remote display unit 14. If the remote display unit 14 responds, IR communication rather than RF communication will be utilized as indicated at 88. On the other hand, if remote display unit 14 does not respond to the "ping," it is assumed that remote display unit 14 is separated from base unit 12. In this case, as indicated at 90, RF communication will be utilized rather than IR communication.

Referring now specifically to FIG. 6, a similar process occurs at control circuitry 60 of remote display unit 14. The process starts as indicated at 92. Initially, the process assumes a "radio on" condition, meaning that communication will occur via RF (as indicated at 94). Nevertheless, the process will continually listen for a "ping" via IR, as indicated at 96. Decision block 98 asks whether or not a ping is "heard." If a ping is heard, as indicated as 100, RF communication is switched off and IR communication will be utilized. On the other hand, if no ping is heard, the radio will remain on and RF communication will be utilized as indicated at 102.

Automatic communication switching between RF and IR modes as described in reference to the preceding figures is disclosed in copending application Ser. No. 12/356,885, filed Jan. 21, 2009, which is incorporated herein by reference in its entirety for all purposes. It is desirable in the RF mode for base unit 12 and display 14 to be "bound" to one another for communication purposes. In other words, a particular base unit 12 "knows" the identity of a specific remote display unit 14 with which it can communicate. Similarly, a particular remote display unit 14 "knows" the identity of the specific base unit 12 to which it is bound. Communication with members of other pairs is precluded.

The identity of a base unit 12 or remote display unit 14 is generally set in the factory by establishing a unit communication ID, or "address." For example, the address may be an eight-digit number that is hard-programmed when the unit is manufactured. The address of the other unit to which it is bound for communication purposes could also be hard-programmed at the factory. So long as the base unit 12 and its bound remote display unit 14 remain together, such a technique works well. Difficulties arise, however, if it is necessary to replace one of the two units at a later time. For example, if a remote display unit needed to be replaced, it is necessary in this situation to know the address of the initial remote display unit and hard-program that address into the replacement remote display unit before communication with the base unit could occur.

Moreover, situations may arise where two or more identical DMMs are used in close proximity to one another. In such cases, difficulties could arise if the remote display unit 14 of one such DMM is mated with the base unit 12 of another DMM at the end of the measurement session. When an attempt is made later to use this combination, no RF communication will occur between the base unit 12 and remote display unit 14. The user would likely find this occurrence to be very frustrating.

Figure 7A:
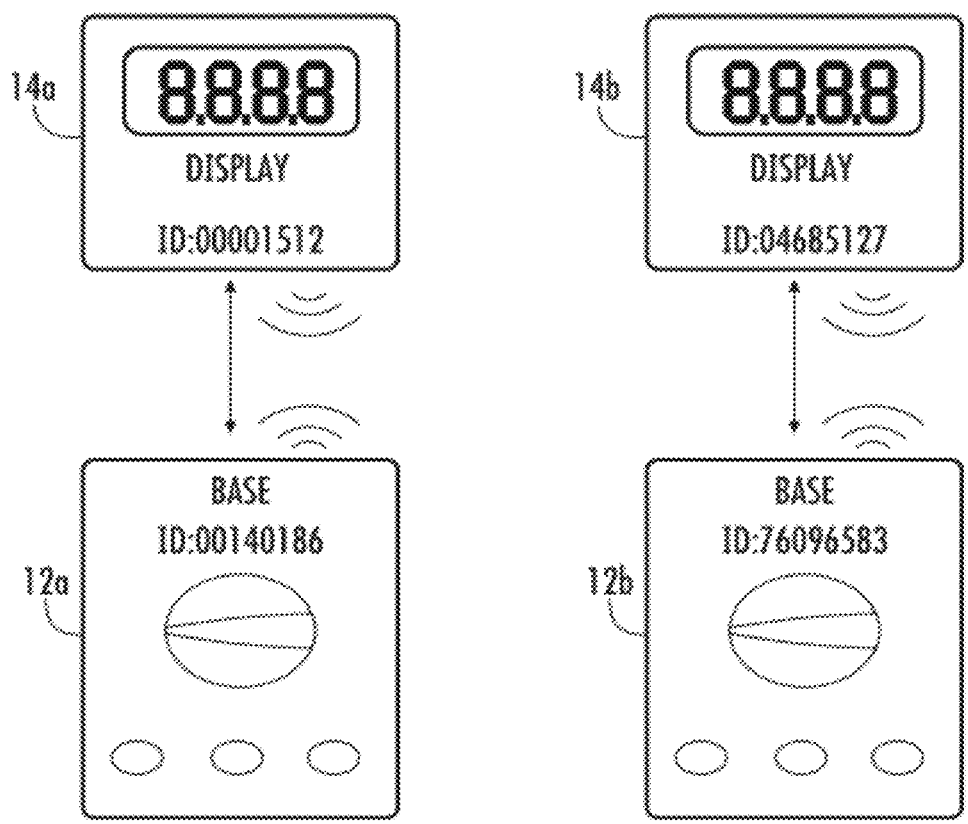
FIGS. 7A through 7C are diagrammatic representations showing automatic communication binding between base units and respective remote display units in accordance with the present invention.

The manner in which an embodiment of the present invention overcomes these difficulties will now be described with reference to FIGS. 7A through 7C. In this regard, FIG. 7A shows a pair of DMMs having respective base units 12a-b and remote display units 14a-b. As can be seen, base unit 12a has an exemplary ID address of "00140186" for communication purposes. Remote display unit 14a has an exemplary ID address of "00001512" for communication purposes. Base unit 12a stores in memory 104 (FIG. 4) that the other member of its bound communication pair is "00001512." Similarly, remote display unit 14a stores in memory 106 (FIG. 4) that the other member of its bound communication pair is "00140186." As a result, base unit 12a and remote display unit 14a will communicate via RF when separated from one another.

Similarly, base unit 12b has an exemplary ID address of "76096583" which is known to remote display unit 14b. Remote display unit 14b likewise has an exemplary ID address of "04685127" which is known to base unit 12b. These two units are thus able to communicate via RF as a bound pair. RF communication with members of other bound pairs is precluded.

The present invention contemplates that a base unit and a remote display unit may exchange ID addresses with each other (i.e., inform the other of their ID address) when connected for "secure communication." For example, the second communication mode which occurs when the two units are mated is deemed to be "secure" because it is not susceptible to interference from another DMM in close proximity. Whether the second communication mode occurs by a wired or optical wireless technique, the specific remote display unit with which the base unit is communicating is known with a high degree of certainty.

Figure 7B:
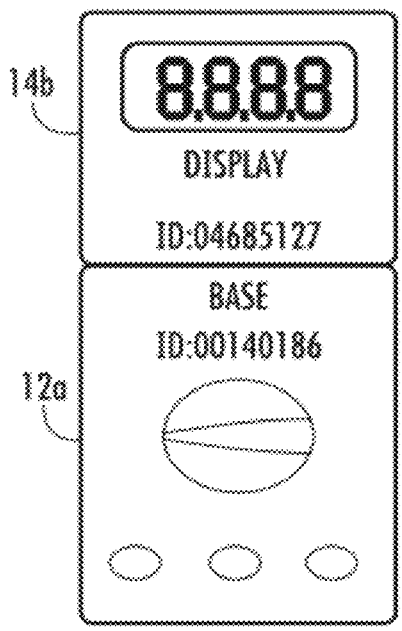

In this regard, FIG. 7B illustrates a situation where remote display unit 14b is mated with base unit 12a. As noted above, such a situation may occur inadvertently if multiple similar DMMs are used in close proximity to one another. Or, the scenario presented in FIG. 7B could occur if it is necessary for some reason to replace remote display unit 14a. When the two units are mated in this manner, they exchange ID addresses with each other to form a new bound pair. Thus, when later separated, base unit 12a (with ID address 00140186) will communicate with remote display unit 14b (with ID address 04685127) and not remote display unit 14a (with ID address 00001512).

Figure 7C:
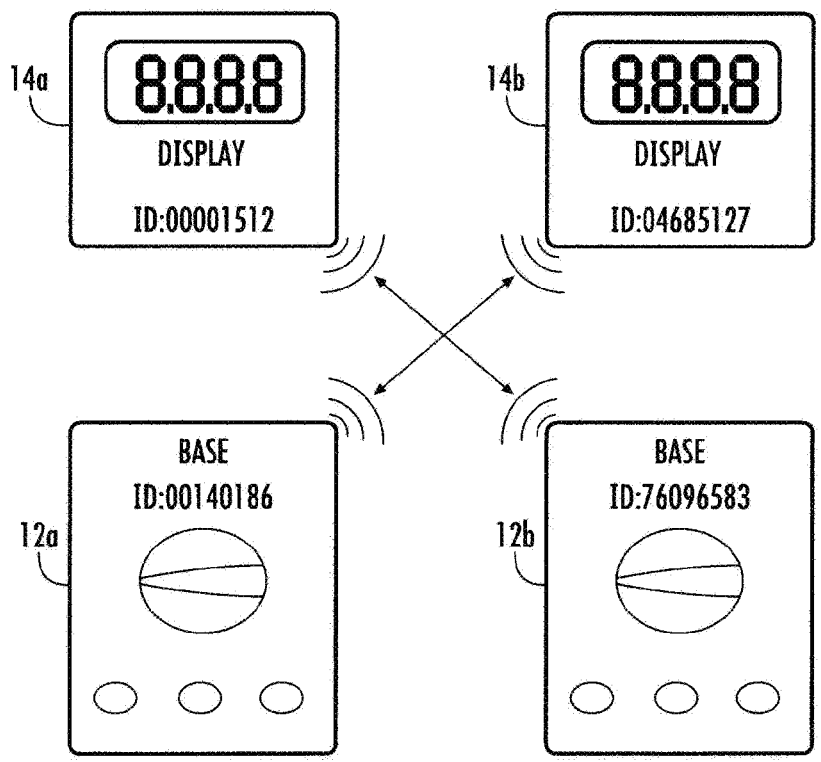

FIG. 7C is similar to FIG. 7A, except the bound pairs have changed in accordance with the present invention. As shown, base unit 12a is now bound to remote display unit 14b for communication purposes. Similarly, base unit 12b is bound for communication purposes to remote display unit 14a.

Figure 8:
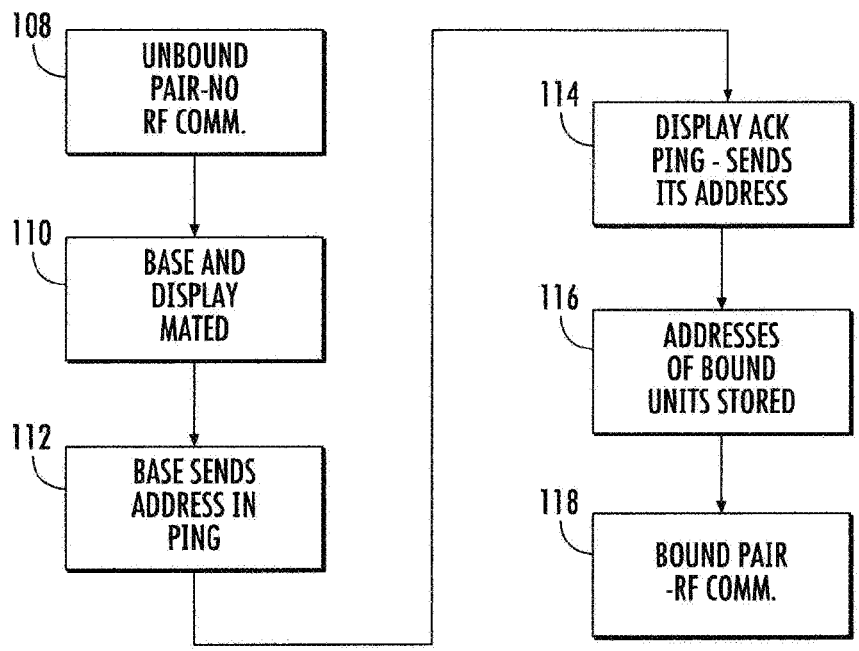
FIG. 8 is a flowchart showing additional details of automatic communication binding in accordance with the present invention.

FIG. 8 is a flowchart showing a preferred methodology by which a base unit and remote display unit may exchange ID addresses in accordance with the present invention. In this case, the pair are not bound at the beginning of the process (as indicated at step 108). As a result, no RF communication can occur between the two units. Next, as indicated at step 110, the base unit and remote display unit are mated (i.e., the remote display unit is docked on the base unit as described above). This turns off the attempt to communicate via RF and establishes secure communication between the two using the second communication mode.

As noted in reference to FIGS. 5 and 6, the second communication mode is preferably established by a "ping" and response between the two units. Referring again to FIG. 8, the ping and response in this case further serve to exchange each other's ID addresses. In this regard, step 112 indicates that the base unit sends its ID address as part of the ping. The remote display unit acknowledges the ping and sends its own address back to the base unit, as shown in step 114. The addresses of the base unit and mated remote display unit are then stored by the other (as indicated at step 116) to establish a bound pair. As shown at step 118, RF communication can then occur when the units are separated from one another.

It can thus be seen that the present invention provides a technique whereby first and second RF wireless devices can be automatically bound for subsequent RF communication after being connected for secure communication. In accordance with the present invention, the primary device automatically transmits its address to the secondary device, which then responds with its own address. This exchange automatically takes place when the two wireless devices are mated. If a new secondary device (with its own unique address) is mated to the primary device, they bind to each other and the original secondary device is no longer bound to the primary device.

Thus, while described in the context of a DMM, one skilled in the art should recognize that principles of the present invention are applicable to other types of devices where RF communication of a bound pair is desired. The present invention avoids the need for complicated set-up routines as may have been required in the past. In addition, the secure communication mode avoids interference from similar devices that may be in close proximity.

While preferred embodiments of the invention have been shown and described, modifications and variations may be made thereto by those of ordinary skill in the art without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to be limitative of the invention as further described in the appended claims.

What is claimed is:

1. An electrical test instrument comprising:
a base unit having a first communication address;
a remote display unit separate from said base unit, said remote display unit having a second communication address;
communication circuitry operative to provide electrical communication in a first RF mode between said base unit and said remote display unit as a bound communication pair based on said first and second communication addresses; and
said communication circuitry further operative to operate selectively in a second secure communication mode to provide electrical communication between said base unit and said remote display unit, said first and second communication addresses being exchanged in said second secure communication mode to establish said bound communication pair for subsequent communication in said first RF mode.

2. An electrical test instrument as set forth in claim 1, wherein said second communication mode is an optical communication mode.

3. An electrical test instrument as set forth in claim 2, wherein said optical communication mode is an IR communication mode.

4. An electrical test instrument as set forth in claim 1, wherein said remote display unit is matable with said base unit.

5. An electrical test instrument comprising:
a base unit having a first communication address;
a remote display unit separate from and matable with said base unit, said remote display unit having a second communication address;
communication circuitry operative to provide electrical communication in a first RF mode between said base unit and said remote display unit as a bound communication pair based on said first and second communication addresses;
said communication circuitry further operative to operate selectively in a second secure communication mode, said first and second communication addresses being exchanged in said second secure communication mode to establish said bound communication pair for subsequent communication in said first RF mode; and
wherein said communication circuitry automatically switches to said second secure communication mode when said remote display unit is mated with said base unit.

6. An electrical test instrument as set forth in claim 1, wherein said communication circuitry provides electrical communication in said first RF mode when said base unit and said remote display unit are spaced apart and in said second secure communication mode when said base unit and said remote display unit are adjacent to one another.

7. An electrical test instrument as set forth in claim 6, wherein said second secure communication mode is an IR communication mode.

8. An electrical test instrument as set forth in claim 7, wherein said communication circuitry attempts to establish communication from said base unit in said IR communication mode and then switches to an RF communication mode if IR communication is unsuccessful.

9. An electrical test instrument as set forth in claim 1, wherein said electrical test instrument is a multimeter.

10. An electrical test instrument as set forth in claim 9, wherein said base unit includes a rotary selector knob and a plurality of test lead jacks.

11. An electrical test instrument as set forth in claim 5, wherein said second communication mode is an optical communication mode.

12. An electrical test instrument as set forth in claim 11, wherein said optical communication mode is an IR communication mode.

13. An electrical test instrument as set forth in claim 5, wherein said electrical test instrument is a multimeter.

14. An electrical test instrument as set forth in claim 13, wherein said base unit includes a rotary selector knob and a plurality of test lead jacks.

* * * * *